United States Patent [19]

Inoue

[11] Patent Number: 5,191,551

[45] Date of Patent: Mar. 2, 1993

[54] NON-VOLATILE SEMICONDUCTOR MEMORY DEVICE WITH TRANSISTOR PARALLELING FLOATING GATE TRANSISTOR

[75] Inventor: Tatsuro Inoue, Tokyo, Japan

[73] Assignee: NEC Corporation, Tokyo, Japan

[21] Appl. No.: 799,165

[22] Filed: Nov. 27, 1991

[30] Foreign Application Priority Data

Nov. 30, 1990 [JP] Japan .................................. 2-340100

[51] Int. Cl.$^5$ .............................................. G11C 11/40
[52] U.S. Cl. ................................ 365/185; 365/189.11; 365/218; 365/230.06; 257/316
[58] Field of Search ................... 365/185, 189.11, 218, 365/230, 06; 357/23.5

[56] References Cited

U.S. PATENT DOCUMENTS

| | | | |
|---|---|---|---|
| 4,580,247 | 4/1986 | Adam | 365/185 |
| 4,677,590 | 6/1987 | Arakawa | 365/185 |
| 4,807,188 | 2/1989 | Casagrande | 365/185 |
| 4,896,298 | 1/1990 | Kowalski | 365/185 |
| 4,996,669 | 2/1991 | Endoh et al. | 365/185 |
| 5,075,890 | 12/1991 | Itoh et al. | 365/189.11 |
| 5,105,386 | 4/1992 | Andoh et al. | 365/230.06 |

*Primary Examiner*—Joseph E. Clawson, Jr.
*Attorney, Agent, or Firm*—Laff, Whitesel, Conte & Saret

[57] ABSTRACT

A non-volatile semiconductor memory device is formed by a plurality of memory cell array groups arranged in a matrix form. Each of the memory cell array groups includes a transistor group. The transistor group is composed of a plurality of transistor pairs connected in series, the transistor pair being formed by a memory transistor and a first selecting transistor connected in parallel with each other. At least one second selecting transistor is connected between a bit line and the transistor group. The memory transistor is over-layered above the first selecting transistor. Such an arrangement of the non-volatile semiconductor memory device does not require an intermediate potential for selective write, so that the write can be made at a relatively low voltage, can avoid the problems of an excess write and an excess erasure, has a wide voltage margin for write/erasure, can be easily fabricated even if the first gate insulating film is thick, and has the functions of a word write and a word erasure.

4 Claims, 9 Drawing Sheets

NON-VOLATILE SEMICONDUCTOR MEMORY DEVICE WITH TRANSISTOR PARALLELING FLOATING GATE TRANSISTOR

BACKGROUND OF THE INVENTION (1) Field of the Invention

The present invention relates to a non-volatile semiconductor memory device and, more particularly, to a nonvolatile semiconductor memory device such as an electrically erasable programmable ROM (hereinafter referred to as "EEPROM") in which the data stored in a memory transistor can be erasable and a new data can be written therein.

(2) Description of the Related Art

Several kinds of non-volatile semiconductor memory devices in which the stored data does not disappear even when a power supply is turned off have been conventionally researched and developed. In recent years, development of EEPROM among them has been advanced speedily so that several kinds of products thereof have been in practical use. There are EEPROMs having a wide variety of structures. Recently, the EEPROM with memory transistors connected in series has been proposed (R. Shirota et al. "Technical digest of 1988 symposium on VLSI technology", pp. 33-34).

Now referring to FIG. 1 showing an equivalent circuit of one example of the those conventional non-volatile semiconductor memory devices, the circuit arrangement of the related art will be explained below.

In FIG. 1, reference symbols $Q_{Si,j}$ (i=1~2 and j=1~4) denote selecting transistors and reference symbols $Q_{Mi,j}$ (i=1~2, j=1~6) denote memory transistors. The control electrodes of the memory transistors $Q_{Mi,j}$ (i=1~2, j=1~6) are connected with word lines Xi (i=1~6) for each row. Among the selecting transistors $Q_{Si,j}$ (i=1~2, j=1~4), the gate electrodes of first selecting transistors ($Q_{S1.1}$, $Q_{S1.3}$; $Q_{S2.1}$, $Q_{S2.3}$) connected with bit lines Y1 and Y2 are, respectively, connected with the corresponding first select lines Z1 and Z3 and, in the same manner, the gate electrodes of second of selecting transistors ($Q_{S1.2}$, $Q_{S1.4}$; $Q_{S2.2}$, $Q_{S2.4}$) connected with a source line S are connected with the corresponding second select lines Z2 and Z4, respectively.

Two groups of transistors each group comprising one first selecting transistor, three memory transistors and one second selecting transistor are connected in series between the bit line Y1 and the source line S and between the bit line Y2 and the source line S, respectively. The bit lines Y1 and Y2 are connected to the drain electrodes of the first selecting transistors ($Q_{S1.1}$, $Q_{S1.3}$; $Q_{S2.1}$, $Q_{S2.3}$) for each column.

FIG. 2A is a plan view of a group of transistors arranged between the bit line and the source line of the memory device, and FIG. 2B is a sectional view taken along the line A—A' in FIG. 2A. In FIGS. 2A and 2B, the numeral 21 denotes a semiconductor substrate; 22a denotes a drain region of the first selecting transistor; 22b denotes a source region of the second selecting transistor; 22c denotes impurity diffusion regions connecting the respective selecting and the memory transistors in series; 23a, 23b denote gate insulating films of the first and second selecting transistors; 24 denotes a first gate insulating film of the memory transistor; 25 denotes a second gate insulating film of the memory transistor; 26 denotes a floating gate; 27 denotes a control (regular) gate; 28a, 28b denote gate electrodes of the first and second selecting transistors; 29 denotes an inter-layer insulating film; 30 denotes a contact hole; and 31 denotes a metal wiring for the bit line.

The structural feature of the above non-volatile semiconductor memory device resides in that the first gate insulating film 24 of the memory transistor is as thin as 90 Å, so that tunneling action is likely to occur between the floating gate electrode 26 and the semiconductor substrate 21 and also between the floating gate electrode 26 and a source/drain electrode. Therefore, using the operating theory based on such a phenomenon, this non-volatile semiconductor memory device electrically writes and erases data in the memory transistor.

The operating theory of the above non-volatile semiconductor memory device will be explained with the attention being paid to the group of transistors ($Q_{S1.1}$, $Q_{M1.1}$, $Q_{M1.2}$, $Q_{M1.3}$, $Q_{S1.2}$) connected in series (FIG. 1) assuming that these transistors are all of N-channel type. TABLET 1 shows the respective potentials at the bit line Y1, the first and second select lines Z1 and Z2, and the word lines X1, X2 and X3 in each mode of data erasing, data writing and data reading. The values in the table are expressed in volt (V).

TABLE 1

| OPERATION MODE SELECTED TRANSISTOR | ERASURE NO SELECTIVITY | WRITE | | | READ | | |
|---|---|---|---|---|---|---|---|
| | | QM1.1 | QM1.2 | QM1.3 | QM1.1 | QM1.2 | QM1.3 |
| BIT LINE Y1 | 0 | 20 | 20 | 20 | 1 | 1 | 1 |
| FIRST SELECT LINE Z1 | 5 | 20 | 20 | 20 | 5 | 5 | 5 |
| WORD LINE X1 | 17 | 0 | 20 | 20 | 0 | 5 | 5 |
| WORD LINE X2 | 17 | 0 | 0 | 20 | 5 | 0 | 5 |
| WORD LINE X3 | 17 | 0 | 0 | 0 | 5 | 5 | 0 |
| SECOND SELECT LINE Z2 | 5 | 0 | 0 | 0 | 5 | 5 | 5 |
| SOURCE LINE S | 0 | 0 | 0 | 0 | 0 | 0 | 0 |

It should be noted that "data erasure" means to inject electrons into the floating gate electrode and "data write" means to extract the electrons from the floating gate electrode.

First, an explanation will be given of the mode of erasing data stored in the transistors $Q_{M1.1}$, $Q_{M1.2}$ and $Q_{M1.3}$. The bit line Y1 and the source line S are set at a ground potential (=0 V) and the word lines X1, X2 and X3 are set at a high positive voltage, e.g., 17 V. The first and the second select lines Z1 and Z2 are set at 5 V, so that the channel potential and the potentials at the source and drain electrodes of each of the memory transistors $Q_{M1.1}$, $Q_{M1.2}$ and $Q_{M1.3}$ are fixed to 0 V. Then, the positive high voltage applied to the control gate electrode 27 of each of the memory transistors $Q_{M1.1}$, $Q_{M1.2}$ and $Q_{M1.3}$ strengthens the electric field in the first gate insulating film 24, so that Fowler-Nordheim electron tunneling phenomenon (hereinafter referred to as "F-N tunneling phenomenon") takes place. This injects electrons from the semiconductor substrate 21 and the impurity diffusion layer 22c into the floating gate electrode 26 through the first gate insulating film 24. Thus, the threshold voltage of each of the memory transistors $Q_{M1.1}$, $Q_{M1.2}$ and $Q_{M1.3}$ is boosted. The resultant state is the state where the data have been erased. This data erasing mode has no selectivity of the memory transistors so that the data stored in all the memory transistors are simultaneously erased.

Next, an explanation will be given on the mode of writing or storing data in the memory transistor $Q_{M1.1}$, $Q_{M1.2}$ or $Q_{M1.3}$. A high positive voltage, e.g., 20 V is set to the bit line Y1, the first select line Z1, and the word line(s) X1, X2 and X3 for the memory transistor(s) nearer to the bit line Y1 than the memory transistor $Q_{M1.1}$, $Q_{M1.2}$ or $Q_{M1.3}$ in which data are to be stored. Also, at the same time, a ground potential is set to the source line S and the word line(s) X1, X2 and X3 for the memory transistor itself to be stored with data and for the memory transistor(s) nearer to the source line S than the memory transistor $Q_{M1.1}$, $Q_{M1.2}$ or $Q_{M1.3}$ in which data are to be stored. Then, the control gate electrode 27 of the memory transistor to be stored with data is at the ground potential and the drain electrode thereof is at the high positive potential of 20 V, so that a strong electric field is applied to the first gate insulating film 24 of the memory transistor to be stored with data. Thus, the electrons are emitted from the floating gate electrode 26 of the memory transistor to be stored with data, towards the impurity diffusion layer 22c based on the F-N tunneling phenomenon. At this time, the memory transistor in which the high voltage has been applied to its control electrode 27 and its drain electrode serves as only a transfer gate, and since the electric field applied to the first gate insulating film 24 of the memory transistor concerned in a biased state is weak, the F-N tunneling phenomenon does not occur thereat.

Further, in the memory transistor(s) positioned nearer to the source line S than the memory transistor to be stored with data, its control gate electrode 27 is at the ground potential but the potential at its drain electrode does not go up because it is cut off by the memory transistor to be stored with data. As a result, the strength of electric filed in the first gate insulating film 24 becomes weak and so the F-N tunneling phenomenon does not occur. Thus, the selective writing of data in the memory transistor can be attained. If the number of memory transistors to be stored with data is plural, data are successively stored in the plural memory transistors connected with the selecting transistor $Q_{S1.1}$ in the order of the memory transistors nearer to the source line S in the way as described above. This intends to protect the data already stored in the memory transistor from the electric field stress during the data writing in the memory transistor and to prevent the variations in the threshold voltage of the memory transistor. Additionally, the second select line Z2 connected with the gate electrode of the second selecting transistor $Q_{S1.2}$ must be kept at 0 V during the data writing. This is because, in the case where the memory transistor already stores data and the channel current flows therethrough even when the potential at the control gate electrode thereof is 0 V, such channel current must be cut off.

Lastly, an explanation will be given on the mode of reading out of the data in the memory transistors.

In this mode, the bit line Y1 is fixed to 1 V, and the first and second select lines Z1 and Z2 are fixed to 5 V. Further, only the word line X1, X2 or X3 which is connected with the memory transistor from which the data are to be read out is set at the ground potential and all the other remaining word lines are set at 5 V. In this state, if the selected memory transistor is in an erased state, its threshold voltage is a positive value so that no current flows from the bit line Y1 to the source line S. On the other hand, if the selected memory transistor is in a written state, the threshold voltage thereof is a negative value so that there flows a current from the bit line Y1 to the source line S. All the other remaining non-selected memory transistors serve as transfer gates. It should be noted that in this operation mode, the threshold voltage of each of the memory transistors must be kept controlled lower than the control gate voltage, e.g., 5 V.

An explanation will be given on the bias conditions of the four transistors in a write state with the memory transistors $Q_{M1.3}$, $Q_{M2.3}$, $Q_{M1.6}$ and $Q_{M2.6}$ being taken as representatives amongst the four transistor groups each comprising the transistors connected in series as shown in FIG. 1. TABLE 2 shows the potentials at each of the bit lines, each of the word lines and the first and second select lines.

TABLE 2

| WRITE TRANSISTOR | BIT LINE Y1 | BIT LINE Y2 | FIRST SELECT LINE Z1 | SECOND SELECT LINE Z2 | FRIST SELECT LINE Z3 | SECOND SELECT LINE Z4 | WORD LINE X3 | WORD LINE X6 |
|---|---|---|---|---|---|---|---|---|
| QM1.3 | 20 | 10 | 20 | 0 | 0 | 0 | 0 | 0 |
| QM2.3 | 10 | 20 | 20 | 0 | 0 | 0 | 0 | 0 |
| QM1.6 | 20 | 10 | 0 | 0 | 20 | 0 | 0 | 0 |
| QM2.6 | 10 | 20 | 0 | 0 | 20 | 0 | 0 | 0 |

The respective control gate electrodes 27 of the memory transistors $Q_{M1.3}$, $Q_{M2.3}$ are connected with the same word line X3, and those of the memory transistors $Q_{M1.6}$ and $Q_{M2.6}$ are connected with the same word line X6. Therefore, selective write for the memory transistors $Q_{M1.3}$, $Q_{M2.3}$ and the memory transistors $Q_{M1.6}$ and $Q_{M2.6}$ is executed by controlling the potentials at the bit lines Y1 and Y2.

Now, assuming that data will be stored in $Q_{M1.3}$ but data will not be stored in $Q_{M2.3}$. Then, $Q_{M1.3}$ is placed in a write bias state as described above but, since the data should not be stored in $Q_{M2.3}$, the bit line Y2 is held at an intermediate voltage of 10 V. Thus, the transistor $Q_{M2.3}$ is biased in such a state where 0 V is applied to its control gate electrode and 10 V is applied to its drain electrode. While the transistor $Q_{M1.3}$ is biased in such a state where 0 V is applied to its control gate electrode and 20 V is applied to its drain electrode, the drain electrode of the transistor $Q_{M2.3}$ has a low voltage of 10 V, so that the electric field applied to the first gate insulating film is lower in the $Q_{M2.3}$ than in the $Q_{M1.3}$. Therefore, the F-N electron tunneling phenomenon will not occur in the $Q_{M2.3}$ so that the data is not erroneously stored in this transistor $Q_{M2.3}$. In this state, the memory transistors $Q_{M2.1}$ and $Q_{M2.2}$ are biased in such a state that 20 V is applied to their control gate electrodes and 10 V is applied to their drain electrodes. In this state also, the potential difference between the control gate electrode and the drain electrode is smaller than that in the erasing mode, so that the F-N electron tunneling phenomenon does not occur. Therefore, during the writing operation, the data stored in the non-selected memory transistors connected with the non-write bit line (Y2) are not erased. With respect to the transistors $Q_{M1.6}$ and $Q_{M2.6}$, the word line X6 is biased to 0 V, and their drain electrodes are separated from the bit lines Y1 and Y2 by the first selecting transistors $Q_{S1.3}$ and $Q_{S2.3}$ with their gate electrodes fixed to 0 V by the first select line Z3. Therefore, no electric field stress is applied to the memory transistors, so that no erroneous erasure and write occur in these memory transistors.

As described above, it is apparent that in order to obviate erroneous write for the memory transistors connected with a common word line, the intermediate potential of, e.g., 10 V is required. Also, in the case where the bit line is controlled using only two values of, e.g., 0 V and 20 V but without using the intermediate potential (10 V), the erroneous write for the memory transistors connected with the common word line can be avoided during the write operation. But, erroneous erasure for the non-selected memory transistors connected with the non-write bit line necessarily advances, so that their threshold voltage will be increased unintentionally. Such a phenomenon is conspicuous in the memory transistors nearer to the bit line and also problematic because the number of times of erasure during the write increases with the number of the memory transistors connected in series. This problem, if the threshold voltage of the non-write transistor exceeds the voltage applied to the control gate electrode during the read operation, leads to a fatal result of erroneous data read.

As understood from the above description, the non-volatile memory device constructed so as to include memory transistors connected in series has the following features.

(1) The Fowler-Nordheim (F-N) electron tunneling phenomenon is used in both the erasing and writing of the data;

(2) In addition to the memory transistors, two selecting transistors are connected in series between the bit line and the source line; and (3) In order to avoid unintentional data erasure in the non-selected transistor during the data writing, three biasing potentials (high, intermediate and low) are used for the bit line.

The conventional non-volatile memory device described above, however, has the following defects.

Three levels of biasing potentials for the bit line are required for the selective write and also the F-N tunneling phenomenon must be controlled using the potential difference between the intermediate potential and the low potential, so that these potentials are required to be set in a relatively narrow range. Particularly, if the intermediate potential is lower or higher than a prescribed value, it gives rise to malfunction, so that an appropriate controlling of the same is a difficult matter in the conventional device.

Further, there is the theoretical problem of excessive erasure, that is, the threshold voltage of a memory transistor exceeds the control gate voltage during a read operation. In order to solve this problem, an erasing voltage must be precisely set and controlled, and the method of fabricating memory transistors is also limited. This lowers the production yield of the memory device.

Moreover, since both the write and erasure modes use the F-N tunneling phenomenon, they require a relatively high voltage. Therefore, both the transistors for bit line controlling and word line controlling must be transistors having high breakdown voltage characteristics. Further, since only the F-N tunneling phenomenon can be utilized for the writing and erasing modes, the first gate insulating film of the memory transistor concerned is required to be a thin silicon oxide film of, e.g., 100 Å or less. It is difficult to control the thickness and the quality of the gate insulating film, so that the production yield of the memory device will be lowered.

The conventional non-volatile semiconductor memory device has also a defect that the operation of writing data in the memory transistors can be made only serially or sequentially from the transistor positioned at the side of the source line. Therefore, in the write operation, it is necessary that, after all bits of data are necessarily once erased, re-programming be executed. For this reason, the functions of word-erasing and word-writing cannot be achieved by the conventional memory device, so that it takes a long time to make the re-programming. As a result, its use as a large capacity non-volatile memory will be extremely limited.

SUMMARY OF THE INVENTION

The present invention has been accomplished to overcome the defects in the prior art as described above.

An object of the present invention is to provide a non-volatile semiconductor memory device which does not require any intermediate potential for selective write so that the write can be effected at a comparatively low voltage, which can avoid the problems of the excess writing and excess erasing, which has a relatively wide voltage margin for the write/erasure, which can be fabricated even if the first gate insulating film is thick, which has the functions of word-write and word-erasure, and which is suitable to realize an increased high integration density.

In order to attain the above object, there is provided a non-volatile semiconductor memory device which comprises:

a memory cell array formed by a plurality of memory cell array groups arranged in a matrix form of rows and columns, each of the memory cell array groups including a transistor group composed of a plurality of transistor pairs connected in series, each transistor pair including a memory MOS field effect transistor (MOS-FET)

having a floating gate electrode and a control gate electrode, and a first selecting MOS-FET having a gate electrode, the memory MOS-FET and the selecting MOS-FET being connected in parallel with each other, and at least one second selecting MOS-FET having a gate electrode and connected in series with one end of the transistor group;

first word lines each connected with the control gate electrode of the memory MOS-FET for each row;

second word lines each connected with the gate electrode of the first selecting MOS-FET for each row;

select lines each connected with the gate electrode of the second selecting MOS-FET for each row;

bit lines each connected with a drain electrode of the second selecting MOS-FET for each column; and a source line commonly connected with the source electrodes of one of the transistors pairs in each of the memory cell array groups, wherein a channel region of the memory MOS-FET is over-layered above the gate electrode of the first selecting MOS-FET arranged at a prescribed area on a semiconductor substrate.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1:
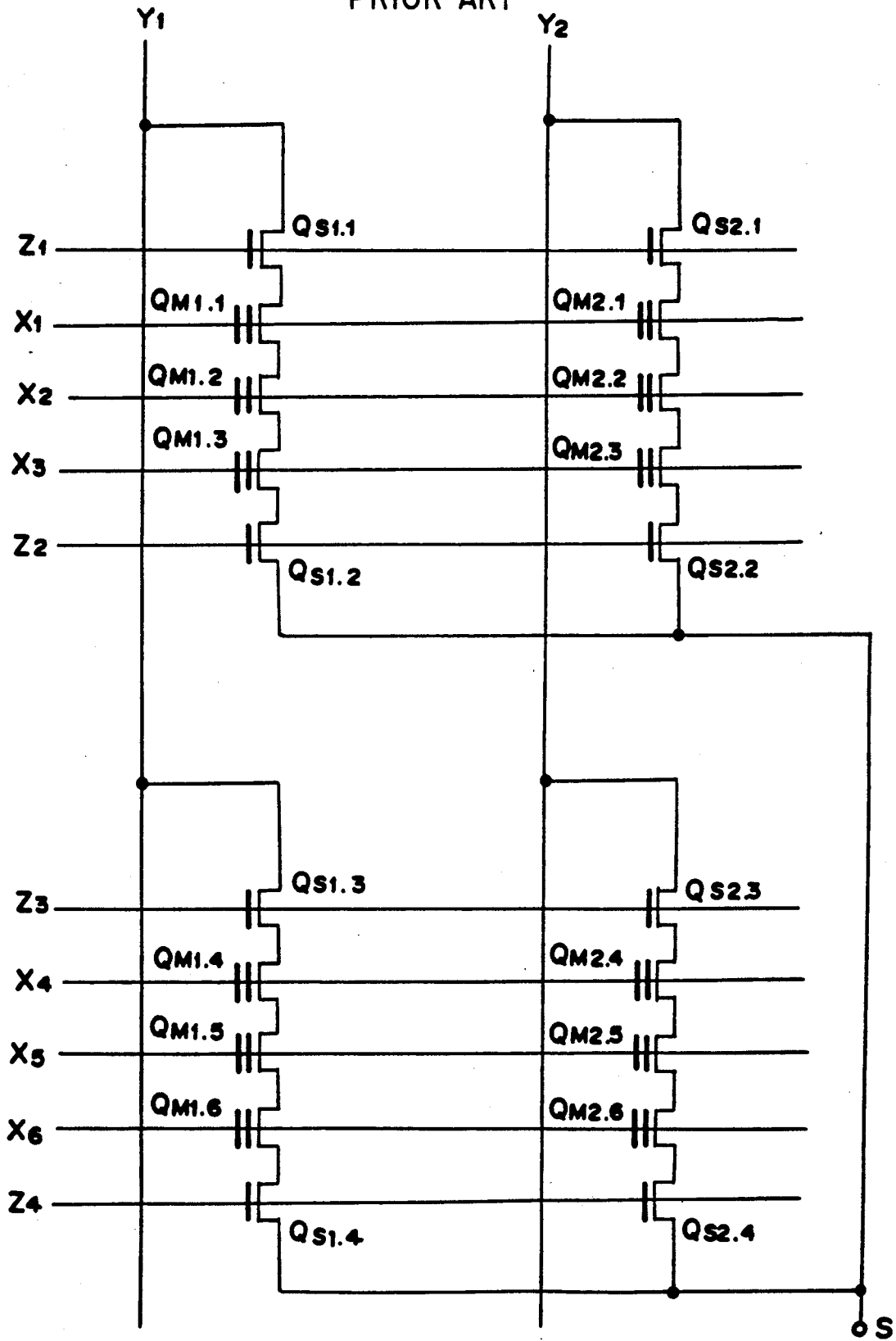
FIG. 1 is an equivalent circuit diagram of the conventional non-volatile semiconductor memory device.
Figure 2A:
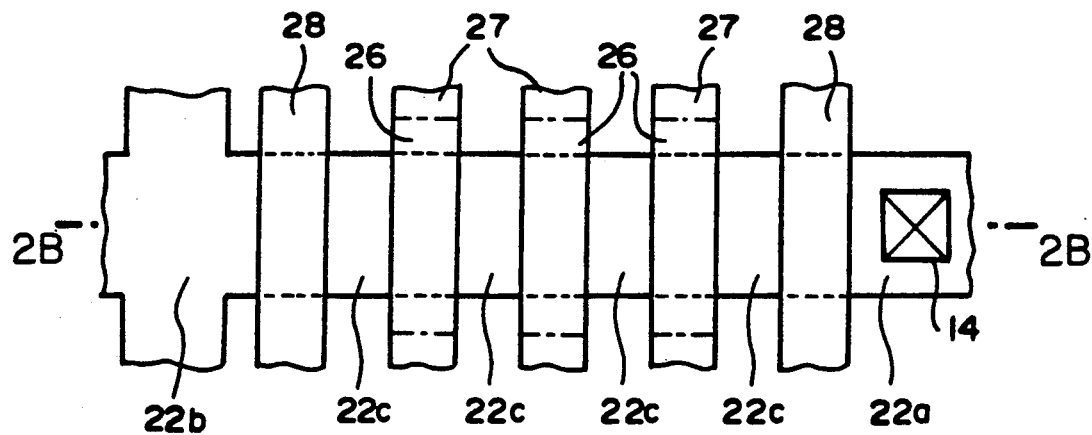
FIG. 2A is a plan view of the conventional non-volatile semiconductor memory device.
Figure 2B:
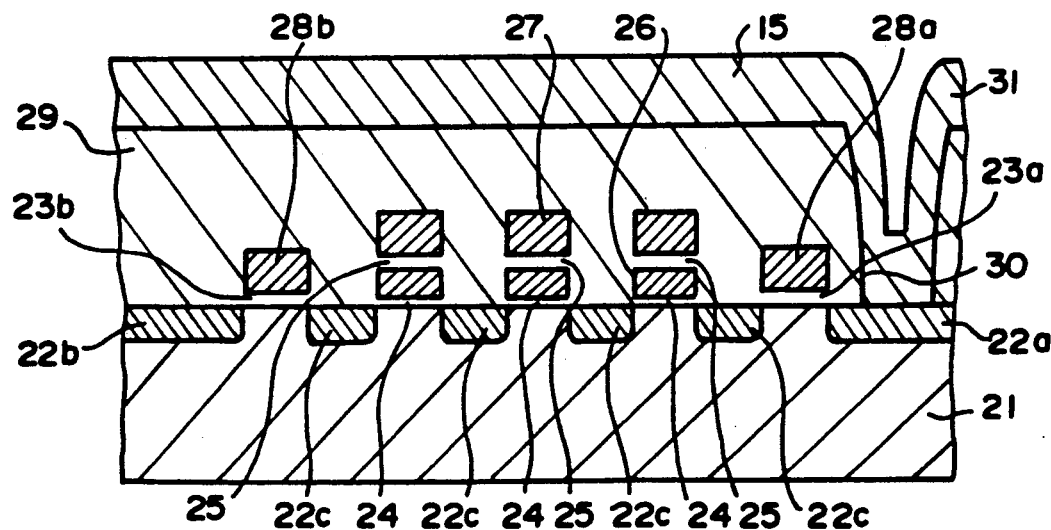
FIG. 2B is a sectional view taken along the line A—A' in FIG. 2A.

Now, referring to the drawings, an explanation will be given on the embodiments of the present invention.

Figure 3:
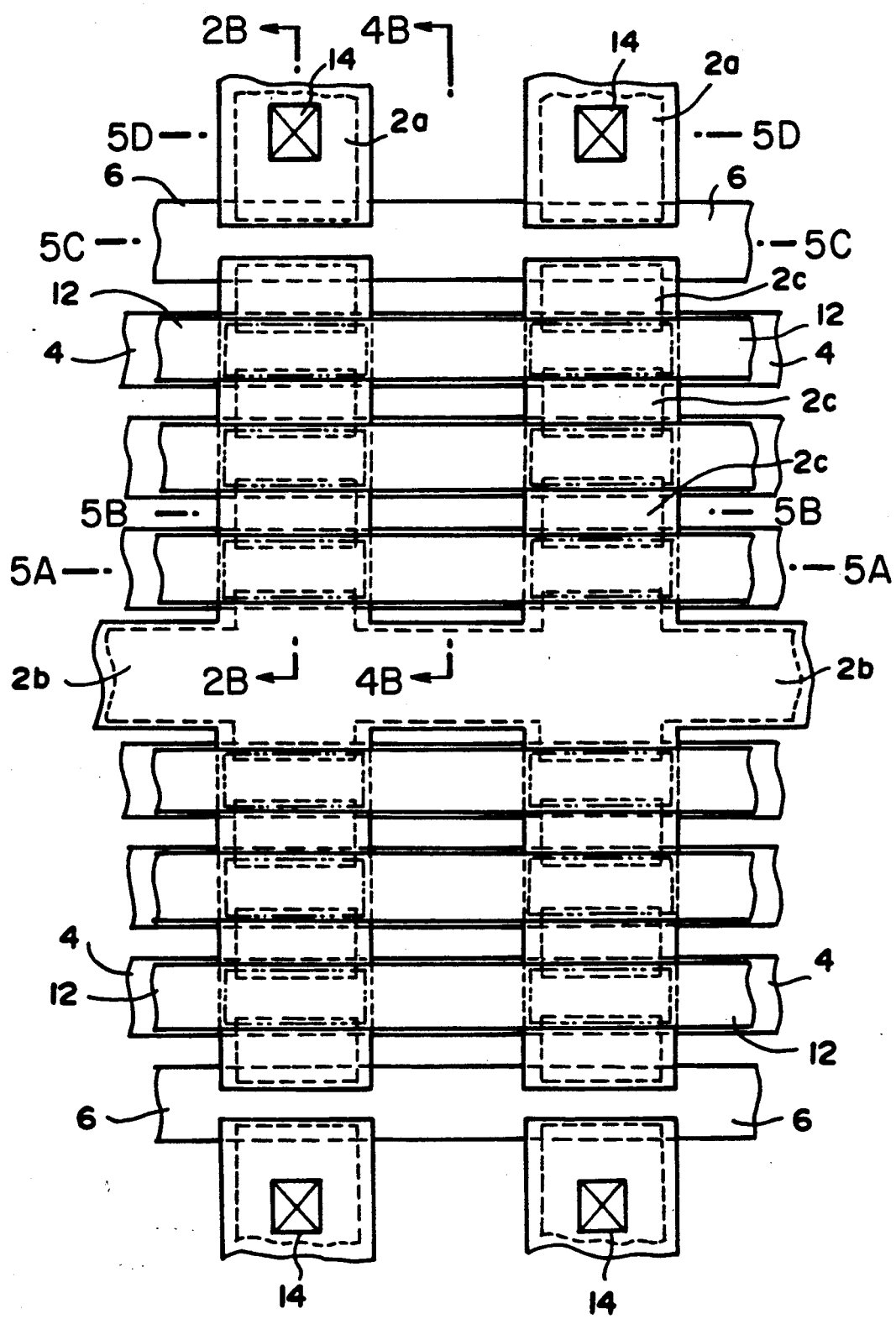
FIG. 3 is a plan view of the non-volatile semiconductor memory device of a first embodiment according to the present invention.
Figure 4A:
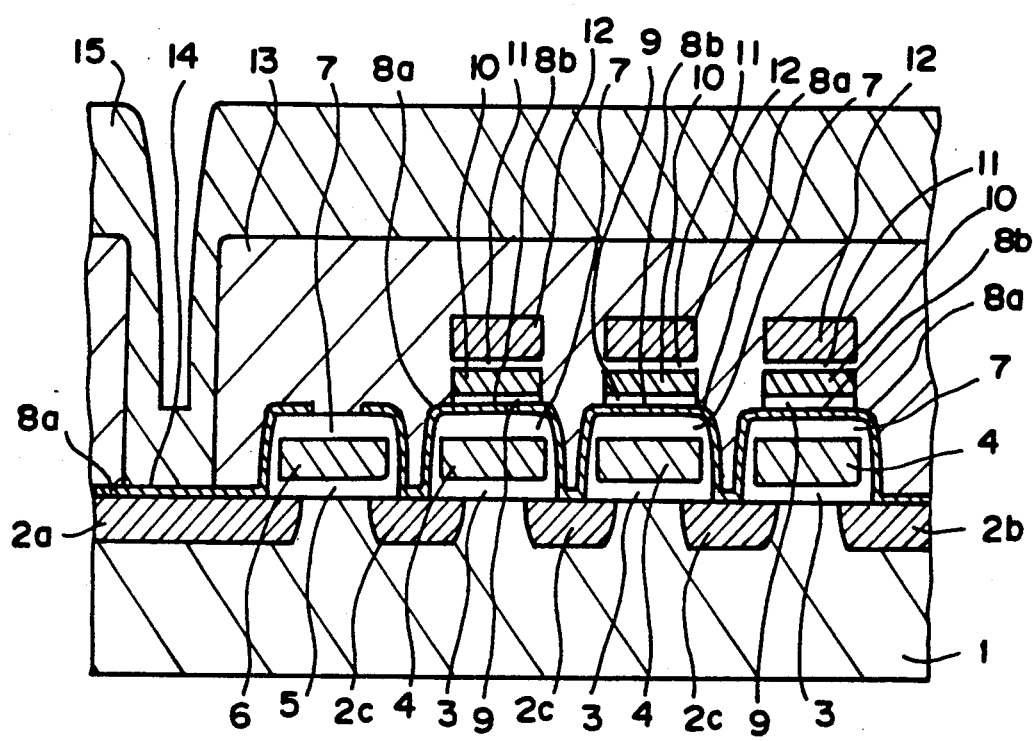
FIG. 4A is a sectional view taken along the line A—A' in FIG. 3.
Figure 4B:
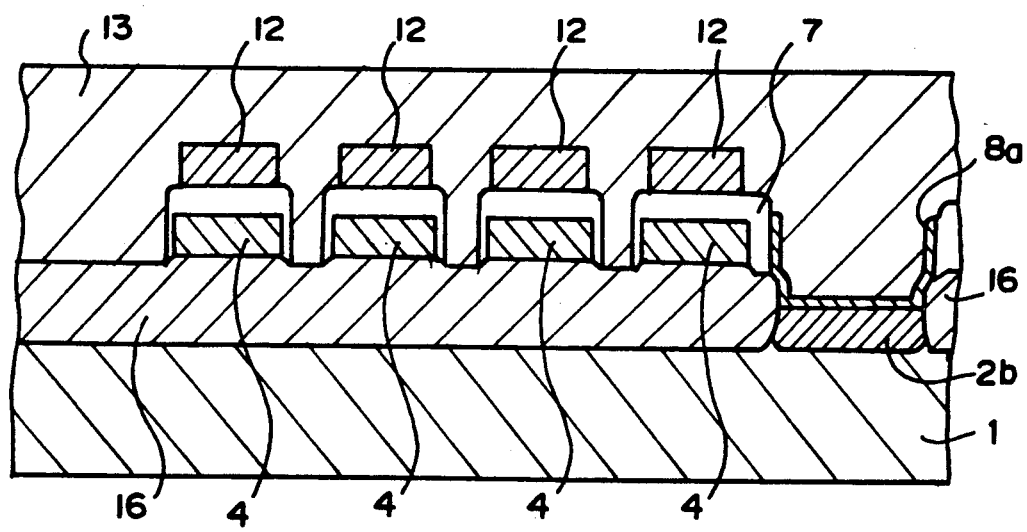
FIG. 4B is a sectional view taken along the line B—B' in FIG. 3.
Figure 5A:
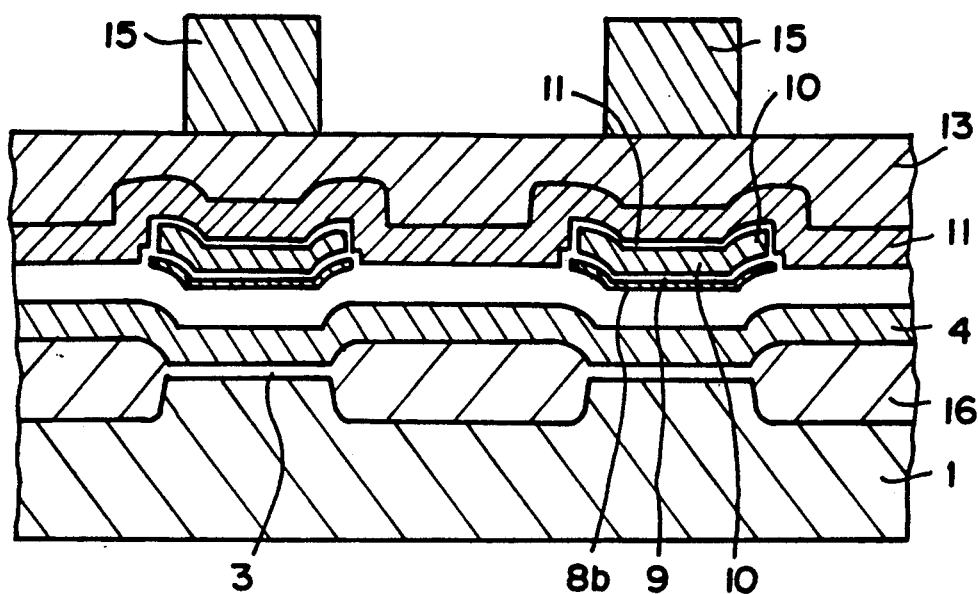
FIG. 5A is a sectional view taken along the line C—C' in FIG. 3.
Figure 5B:
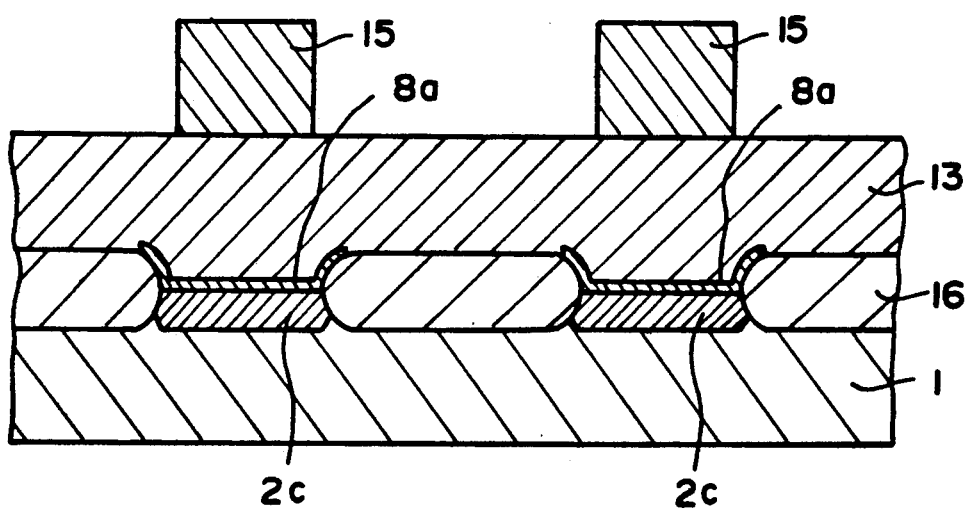
FIG. 5B is a sectional view taken along the line D—D' in FIG. 3.
Figure 5C:
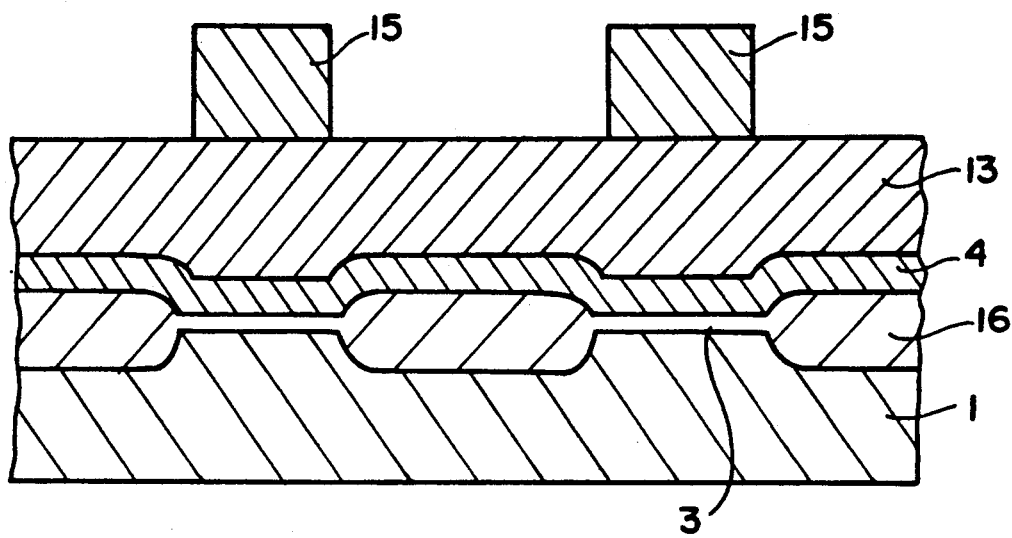
FIG. 5C is a sectional view taken along the line E—E' in FIG. 31.
Figure 5D:
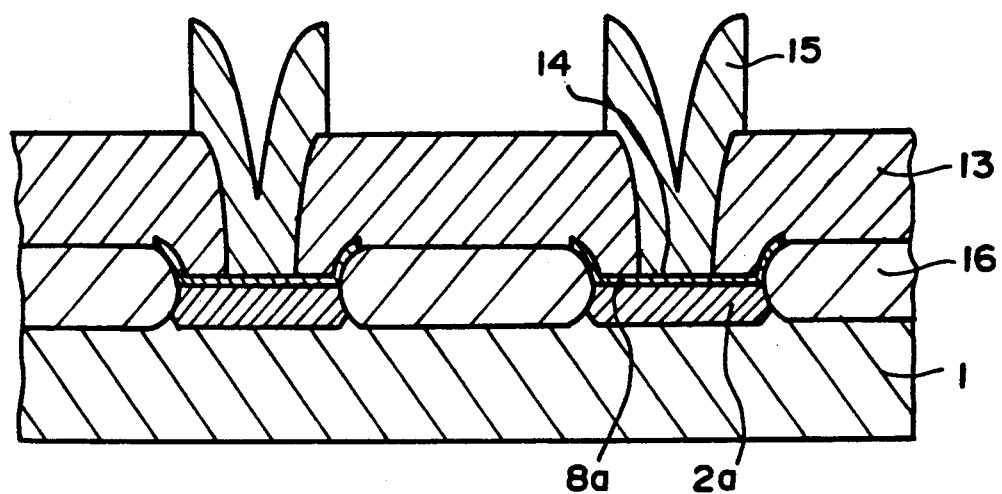
FIG. 5D is a sectional view taken along the line F—F' in FIG. 3.

FIG. 3 is a plan view of the non-volatile semiconductor memory device according to the first embodiment of the present invention. FIGS. 4A and 4B are sectional views taken along the lines A—A' and B—B' in the longitudinal direction in FIG. 3, respectively. FIGS. 5A, 5B, 5C and 5D are sectional views taken along the lines C—C', D—D', F—F' in the horizontal direction in FIG. 3, respectively.

In these figures, the numeral 1 denotes a semiconductor substrate having a resistivity of 130 $\Omega$cm; $2a$, $2b$ and $2c$ denote a first impurity diffusion layer of N-type impurities such as Arsenic (As), respectively; 3 denotes a gate insulating film of a first selecting MOS transistor, which is made of a silicon oxide film having a thickness of, e.g., 300 Å; 4 denotes a gate electrode of the first selecting MOS transistor having a thickness of 3000 Å which is made of polysilicon containing impurities such as Phosphorus (P); 5 denotes a gate insulating film of a second selecting MOS transistor, which is made of a silicon oxide film having a thickness of 300 Å; 6 denotes a gate electrode of the second selecting MOS transistor having a thickness of 3000 Å which is made of polysilicon containing impurities such as Phosphorus (P); 7 denotes an inter-layer insulating film of a silicon oxide film having a thickness of 2500 Å formed by, for example, CVD (Chemical Vapor Deposition) process; $8a$ denotes an impurity diffusion layer of a memory MOS transistor having a thickness of 500 Å of N-type polysilicon highly doped with, e.g., Arsenic (As); $8b$ denotes a channel region of the memory MOS transistor having a thickness of 500 Å which is made of a P-type polysilicon highly doped with, e.g., Boron (B) at a concentration of $3\times10^{-16}$cm$^{-3}$; 9 denotes a first gate insulating film of the memory MOS transistor which is made of, e.g., silicon oxide film having a thickness of 120 Å; 10 denotes a floating gate electrode having a thickness of 2000 Å which is made of polysilicon containing impurities such as Phosphorus (P); 11 denotes a second gate insulating film of the memory MOS transistor which is made of, e.g., silicon oxide film having a thickness 200 Å; 12 denotes a control gate electrode having a thickness of 3000 Å which is made of polysilicon containing impurities such as Phosphorus (P); 13 denotes a metal wiring inter-layer which is made of metal such as BPSG and has a thickness of 1.0 $\mu$m; 14 denotes a contact hole; 15 denotes a metallic wiring made of metal such as Aluminum (Al) having a thickness of 1.0 $\mu$m; and 16 denotes a field insulating film made of, e.g., silicon oxide film having a thickness of 6000 Å.

The gate electrode 6 of the second selecting MOS transistor, which is connected for each row within a cell array as shown in FIG. 3, serves as a select line Ci (i=1, 2). The gate electrode 4 of the first selecting MOS transistor, which is connected for each row within the cell array as shown in FIG. 3, serves as a second word line Zi (i=1~6). The control gate electrode 12, which is connected for each line within the cell array as shown in FIG. 3, serves as a first word line Xi (i=1~6). The field insulating film 16 isolates the impurity diffusion layers $2a$, $2c$ of each transistor from each other for each column.

The non-volatile semiconductor memory device according to this embodiment comprises the second selecting MOS transistor arranged on the semiconductor substrate 1, a plurality of memory MOS transistors connected in series with the second selecting MOS transistor, and a plurality of first selecting transistors each connected in parallel with each of the memory MOS transistors. Further, in order to prevent the planar cell area occupied by the memory MOS transistors from being increased, the memory MOS transistor is layered on the first selecting MOS transistor. To this end, in accordance with this embodiment, the memory MOS transistor is composed of the source/drain electrode of polysilicon on the insulating film, a channel region, the first gate insulating film 9 thereon, the floating gate electrode 10, the second gate insulating film 11 and the control gate electrode 12. The source/drain electrode and the channel region are isolated from each other for each column. The contact hole 14 is made on the drain electrode of the series transistor group, and the metal wiring 15 serving as the bit line is connected with the drain electrode. The source electrodes of the plural transistor groups each composed of the transistors connected in series are commonly connected so as to provide a source diffusion layer wiring.

Figure 6:
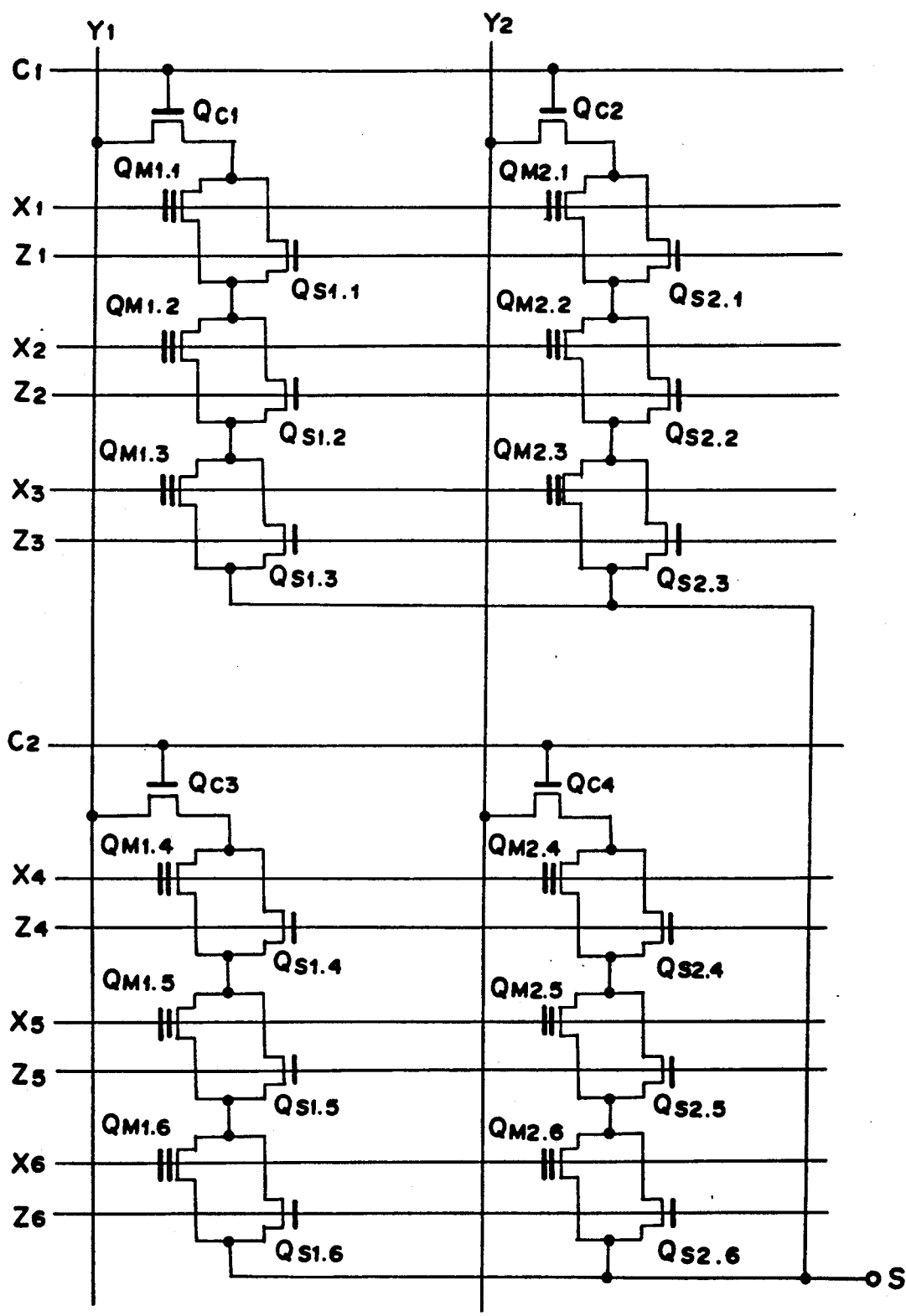
FIG. 6 is an equivalent circuit of the first embodiment of the present invention.

Referring now to the equivalent circuit shown in FIG. 6, an explanation will be given on the operation of the non-volatile semiconductor memory device according to this embodiment. Reference symbol $Q_{Si,j}$ ($i=1\sim2$, $j=1\sim6$) denotes a first selecting transistor, and reference symbol $Q_{Mi,j}$ ($i=1\sim2$, $j=1\sim6$) denotes a memory transistor. The memory transistor $Q_{Mi,j}$ and the first selecting transistor $Q_{Si,j}$ constitute a transistor pair, and three transistor pairs are connected in series to provide a transistor group of, e.g., $Q_{M1.1}$, $Q_{M1.2}$, $Q_{M1.3}$ and $Q_{S1.1}$, $Q_{S1.2}$, $Q_{S1.3}$. The memory cell array is constituted by arranging a plurality of such transistor groups in a matrix form (row and column). In the plan view of FIG. 3, the memory cell array is constituted in a folded layout such that the source diffusion layer wiring and the bit line contact hole 14 are common to the two transistor groups. The control gate electrode 12 of the memory transistor $Q_{Mi,j}$ is connected with the first word line Xi ($i=1\sim6$) for each row, and the gate electrode 4 of the first selecting transistor $Q_{Si,j}$ is connected with the second word line Zi ($i=1\sim6$) for each row. The drain electrode 2a of the transistor group which is composed of the series transistors is connected with the bit line Yi ($i=1\sim2$) for each column. The source electrodes 2b are commonly connected with the source line S. Further, the gate electrode 6 of the second selecting transistor $Q_{Ci}$ ($i=1\sim4$) is connected with the select line Ci ($i=1$, 2) for each row.

TABLE 3 shows the biasing potentials at each word line, each bit line, each select line and the source line, for the representative memory transistors at the write mode. The values on the table are expressed in volts (V).

through the second selecting transistor $Q_{C1}$ and its control gate electrode is supplied with 10 V from the first word line X1. On the other hand, the gate electrode of the first selecting transistor $Q_{S1.1}$ constituting a transistor pair with the memory transistor $Q_{M1.1}$ connected in parallel thereto is supplied with 0 V from the second word line Z1, so that this first selecting transistor $Q_{S1.1}$ turns off. Therefore, the current path due to a voltage applied to the drain electrodes of the $Q_{C1}$ from the bit line Y1 is only the current path passing through the memory transistor $Q_{M1.1}$.

On the other hand, all the control gate electrodes of the other memory transistors $Q_{M1.2}$ and $Q_{M1.3}$ connected in series in the transistor group to which the memory transistor $Q_{M1.1}$ belongs are fixed to 0 V by the first word lines X2 and X3. Further, the gate electrodes of the other first selecting transistors $Q_{S1.2}$ and $Q_{S1.3}$ are supplied with 10 V from the second word lines Z2 and Z3, so that these transistors turn on. Therefore, the source electrode of the selected memory transistor $Q_{M1.1}$ is coupled with the source line S through these selecting transistors $Q_{S1.2}$ and $Q_{S1.3}$ which are of the ground potential. Thus, the channel current flows from the bit line Y1 to the source line S, so that there are generated hot electrons in the channel region of the memory transistor $Q_{M1.1}$ and then these electrons are injected into the floating gate. Since the control gate electrodes of the other memory transistors $Q_{M1.2}$ and $Q_{M1.3}$ belonging to the same transistor group as the selected memory transistors $Q_{M1.1}$ are supplied with 0 V, the potential difference between the source and drain electrodes of these memory transistors is small. For this reason, the writing data for these transistors is not made.

Likewise, in the case of write for the memory transistor $Q_{M1.2}$, the gate electrode of the second selecting transistor $Q_{C1}$ is supplied with 10 V from the select line C1 and its drain electrode is supplied with 6 V from the bit line Y1. The control gate electrodes of the other memory transistor $Q_{M1.1}$ and $Q_{M1.3}$ are supplied with 0 V from the word lines X1 and X2. The gate electrodes of the first selecting transistors $Q_{S1.1}$ and $Q_{S1.3}$ are supplied with 10 V from the word lines Z1 and Z3. The control gate electrode of the selected memory transistor $Q_{M1.2}$ is supplied with 10 V from the first word line X2 while that of the first selecting transistor $Q_{S1.2}$ constituting the transistor pair with the selected memory transistor $Q_{M1.2}$ is supplied with 0 V from the second word line Z2. Thus, the first selecting transistor $Q_{S1.2}$ constituting the transistor pair with the selected memory transistor $Q_{M1.2}$ cuts off the path bypassing the memory

TABLE 3

| SELECTED TRANSISTOR | Y1 | Y2 | C1 | C2 | X1 | Z1 | X2 | Z2 | X3 | Z3 | X5 | Z5 | S |
|---|---|---|---|---|---|---|---|---|---|---|---|---|---|
| QM1.1 | 6 | 0 | 10 | 0 | 10 | 0 | 0 | 10 | 0 | 10 | 0 | 0 | 0 |
| QM1.2 | 6 | 0 | 10 | 0 | 0 | 10 | 10 | 0 | 0 | 10 | 0 | 0 | 0 |
| QM1.3 | 6 | 0 | 10 | 0 | 0 | 10 | 0 | 10 | 10 | 0 | 0 | 0 | 0 |
| QM2.1 | 0 | 6 | 10 | 0 | 10 | 0 | 0 | 10 | 0 | 10 | 0 | 0 | 0 |
| QM1.5 | 6 | 0 | 0 | 10 | 0 | 0 | 0 | 0 | 0 | 0 | 10 | 0 | 0 |
| QM2.5 | 0 | 6 | 0 | 10 | 0 | 0 | 0 | 0 | 0 | 0 | 10 | 0 | 0 |

It should be noted that the expression "write or writing" in the present invention means to inject electrons into the floating gate electrode to raise the threshold voltage of the memory transistor concerned. The write operation in this embodiment utilizes an injection of hot electrons due to a channel current. For example, in the case of writing data for the memory transistor $Q_{M1.1}$, its drain electrode is supplied with 6 V from the bit line Y1 transistor concerned, whereas the other first selecting transistors $Q_{S1.1}$ and $Q_{S1.3}$ form the paths bypassing the non-selected memory transistors $Q_{M1.1}$ and $Q_{M1.3}$. Therefore, the channel current flows between the source and drain of only the selected memory transistor $Q_{M1.2}$. Thus, hot electrons are generated at the channel region, so that these electrons are injected into the floating gate of the selected memory transistor $Q_{M1.2}$. In this state, the first selecting transistors $Q_{S1.1}$ and $Q_{S1.3}$ serve as transfer gates between the bit line Y1 and the source line S.

Additionally, in order to prevent erroneous write/erasure for the other transistor group of memory transistors such as $Q_{M1.5}$ connected with the same bit line Y1, all the first word lines X4~X6, the second word lines Z4~Z6, and the select line C2 connected with the other transistor group are fixed to 0 V. Therefore, no channel current flows through the memory transistors $Q_{M1.4}$, $Q_{M1.5}$ and $Q_{M1.6}$, so that the writing data for these memory transistors is not made. The selective writing for the memory transistors, e.g., $Q_{M1.1}$ and $Q_{M2.1}$ connected with the same word line can be performed on the basis of the voltage at the bit line. Specifically, if during the write for the transistor $Q_{M2.1}$, the voltage at the bit line Y1 is set for 0 V to place the potential difference between the source and drain of the transistor $Q_{M1.1}$ at 0 V, the write for the transistor $Q_{M1.1}$ is not made. Further, no channel current flows in the open state of the bit line Y1 and, in this case also, the write for the transistor $Q_{M1.1}$ is not made.

Next, the erasing mode will be explained below.

TABLEs 4A and 4B show examples of the potentials at each bit line, each word line and the source line in volts (V). It should be noted that the "data erasure or data erasing" means to emit electrons from the floating gate of the memory transistor concerned so that the threshold voltage thereof is lowered.

the source line side. First, the erasure from the source line side will be explained.

In the case of the collective data erasure, selectivity for the memory transistors is not given, but all the word lines X1 to X6 are set for 0 V, all the second word lines Z1 to Z6 are set for 20 V and all the select lines C1 and C2 are set for 0 V. At this state, the potential at the impurity diffusion layer on the source line side, attendantly on the drain side, of each of all the memory transistors $Q_{Mij}$ (i=1~2, j=1~6) is placed at a high potential, so that the electrons are emitted from the floating gate whereby the data stored in the memory transistor are erased.

In the case where a particular word line is selected for the selective data erasure, only the selected first word line is set for 0 V whereas all the remaining first word lines and all the second word lines are set for 20 V. The select lines C1 and C2 are set for 0 V so as to separate each of the transistor groups from the bit lines Y1 and Y2. Since the high voltage of 20 V is applied to the source line S, the electric field between the floating gate electrode and the source/drain electrode in each of the memory transistors connected with the word lines other than the selected word line is weak, so that the F-N tunneling phenomenon does not occur and data erasure is not made for the memory transistors connected with these non-selected word lines. Accordingly, the erasure of data is effected for only the memory transistor connected with the selected first word line.

TABLE 4A

| | | (ERASURE FROM SOURCE LINE SIDE) | | | | | | | | | | | | |
|---|---|---|---|---|---|---|---|---|---|---|---|---|---|---|
| ERASING MODE | SELEC-TIVITY | Y1 | Y2 | C1 | C2 | X1 | Z1 | X2 | Z2 | X3 | Z3 | X4 X6 | X4 X6 | S |
| COLLECTIVE ERASURE | NO | OPEN | OPEN | 0 | 0 | 0 | 20 | 0 | 20 | 0 | 20 | 0 | 20 | 20 |
| WORD LINE ERASURE | WORD LINE X1 | OPEN | OPEN | 0 | 0 | 0 | 20 | 20 | 20 | 20 | 20 | 20 | 20 | 20 |
| | WORD LINE X2 | OPEN | OPEN | 0 | 0 | 20 | 20 | 0 | 20 | 20 | 20 | 20 | 20 | 20 |
| | WORD LINE X3 | OPEN | OPEN | 0 | 0 | 20 | 20 | 20 | 20 | 0 | 20 | 20 | 20 | 20 |

TABLE 4B

| | | (ERASURE FROM BIT LINE SIDE) | | | | | | | | | | | | |
|---|---|---|---|---|---|---|---|---|---|---|---|---|---|---|
| ERASING MODE | SELEC-TIVITY | Y1 | Y2 | C1 | C2 | X1 | Z1 | X2 | Z2 | X3 | Z3 | X4 X6 | X4 X6 | S |
| COLLECTIVE ERASURE | NO | 20 | 20 | 20 | 20 | 0 | 20 | 0 | 20 | 0 | 20 | 0 | 20 | OPEN |
| WORD LINE ERASURE | WORD LINE X1 | 20 | 20 | 20 | 0 | 0 | 20 | 20 | 20 | 20 | 20 | 20 | 20 | OPEN |
| | WORD LINE X2 | 20 | 20 | 20 | 0 | 20 | 20 | 0 | 20 | 20 | 20 | 20 | 20 | OPEN |
| | WORD LINE X3 | 20 | 20 | 20 | 0 | 20 | 20 | 20 | 20 | 0 | 20 | 20 | 20 | OPEN |

The data erasure is performed on the basis of the F-N tunneling phenomenon. Specifically, if a high voltage of, e.g., 20 V is applied to both or one of the source and drain regions of the memory transistor, and a low voltage of, e.g., 0 V is applied to the control gate electrode thereof, the electric field in the first gate insulating film from the floating gate electrode toward the source and drain region is strengthened, so that the F-N tunneling phenomenon occurs whereby electrons are emitted from the floating gate.

As shown in the above TABLEs 4A and 4B, the data erasure can be effected from either the bit line side or In the case of the data erasure from the bit line side, the impurity diffusion layer to which the voltage is applied is the drain region and not the source region unlike the case of erasure from the source line side. The erasure operation itself is the same as in the above case.

Figure 7A:
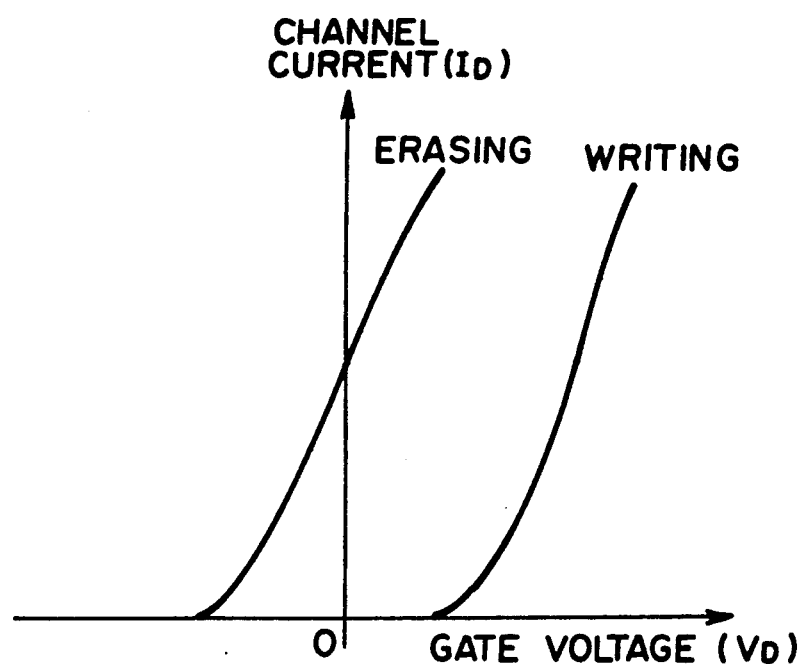
FIG. 7A is a graph showing the relationship between a control gate electrode and a channel current.
Figure 7B:
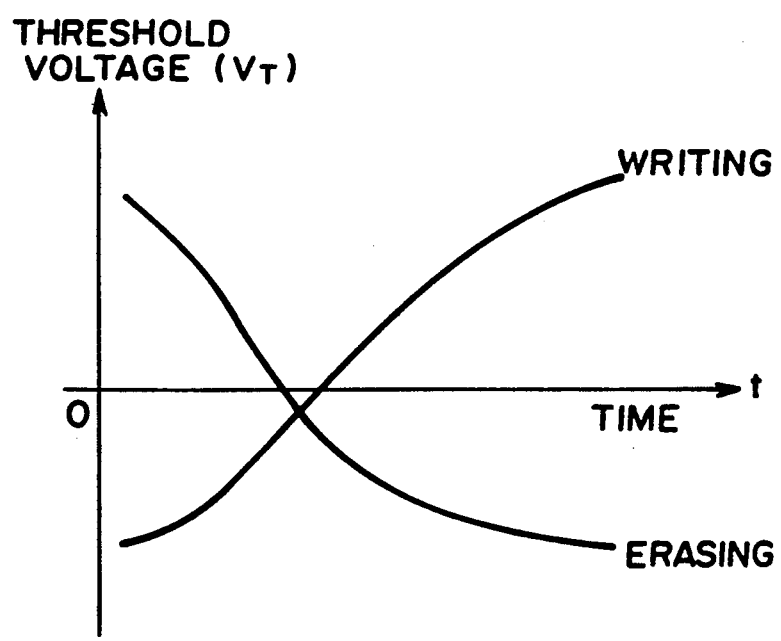
FIG. 7B is a graph showing the changes in a threshold voltage.

FIGS. 7A and 7B shows, respectively, the relation between the gate voltages and the channel currents, and the changes in the threshold voltages of the memory transistor concerned in the above write and erasure modes. In the case of data writing, the threshold voltage is increased since electrons are injected into the floating gate. For this reason, even if the control gate is supplied with 0 V, no channel current flows. In contrast, in the case of data erasure, the threshold voltage is decreased since the electrons are emitted from the floating gate and, thus, with the control gate electrode supplied with 0 V, the channel current flows. FIG. 7B shows the changes in the threshold voltages of the memory transistor with the lapse of time. Here, although the electrical erasing method has been explained above, the collective erasure based on, for example, irradiation of ultra-violet rays may be adopted.

Next, the data read mode will be explained below with reference to TABLE 5 showing the potentials at each bit line, each word line and the source line in volts (V).

TABLE 5

| SELECTED TRANSISTOR | Y1 | Y2 | C1 | C2 | X1 | Z1 | X2 | Z2 | X3 | Z3 | X4 X6 | X4 X6 | S |
|---|---|---|---|---|---|---|---|---|---|---|---|---|---|
| QM1.1 | 1 | 0 | 5 | 0 | 0 | 0 | 0 | 5 | 0 | 5 | 0 | 0 | 0 |
| QM1.2 | 1 | 0 | 5 | 0 | 0 | 5 | 0 | 0 | 0 | 5 | 0 | 0 | 0 |
| QM1.3 | 1 | 0 | 5 | 0 | 0 | 5 | 0 | 5 | 0 | 0 | 0 | 0 | 0 |
| QM2.1 | 0 | 1 | 5 | 0 | 0 | 0 | 0 | 5 | 0 | 5 | 0 | 0 | 0 |
| QM1.1 & QM2.1 | 1 | 1 | 5 | 0 | 0 | 0 | 0 | 5 | 0 | 5 | 0 | 0 | 0 |

It is assumed that data read for the memory transistor $Q_{M2.1}$ is to be made. 0 V is applied from the first word line X1 to the control gate electrode of the selected memory transistor $Q_{M2.1}$, and 0 V is also applied from the second word line Z1 to the gate electrode of the first selecting transistor $Q_{S2.1}$ constituting the transistor pair with the memory transistor $Q_{M2.1}$, so that the channel of the transistor $Q_{S2.1}$ is cut off and only the channel of $Q_{M2.1}$ is used as a current path. The other first selecting transistors $Q_{S2.2}$ and $Q_{S2.3}$ of the transistor group to which the transistor $Q_{M2.1}$ belongs are set for 5 V, so that these selecting transistors are placed in their on states and so serve as transfer gates. Thus, the current paths from the bit line Y2 to the drain electrode of the memory transistor $Q_{M2.1}$ and from the selected memory transistor $Q_{M2.1}$ to the source line S are formed. Therefore, if the selected memory transistor $Q_{M2.1}$ is in its written state and its threshold voltage is higher than 0 V, since control gate electrode of the selected memory transistor $Q_{M2.1}$ is at 0 V, the current path from the bit line Y2 to the source line S is cut off and therefore no current flows. In contrast thereto, if the selected memory transistor $Q_{M2.1}$ is in its erased state and the threshold voltage is lower than 0 V, the current flows therethrough from the bit line Y2 to the source line S.

In this way, the erased state and the written state of the selected memory transistor correspond to the "presence" and the "absence" of the current from the bit line to the source line. By detecting this current by a sense amplifier connected with the bit line, the information corresponding to digital data "0" or "1" can be obtained.

It should be noted that the control gate electrode of the non-selected memory transistor may be either 0 V or 5 V. This is because this memory transistor is not required to serve as a transfer gate because of the presence of the first selecting transistor constituting the transistor pair with it. Also, the threshold voltage of the non-selected memory transistor may have any value in the read operation. In short, the first selecting transistor operates as a transfer gate as long as its threshold voltage is lower than the voltage applied to the second word line, whereby the data read operation can be performed.

In the other transistor groups to which the selected transistor does not belong, all the first word lines, second word lines and select line are fixed to 0 V, so that the current path from the bit line through each of these transistor groups is cut off. Therefore, the read operation is not influenced even if the threshold voltages of all the memory transistors in the other transistor groups are lower than 0 V.

In addition to the read mode described above, it is possible to read out data in parallel from the memory transistors connected with the same first word line. For example, the data can be read out simultaneously from $Q_{M1.1}$ and $Q_{M2.1}$. In this case, the individual sense amplifiers may be connected with the bit lines Y1 and Y2 to produce the data corresponding to the currents sensed.

Provision of the select line provides the following advantageous effect. First, the parasitic leak current flowing through the non-selected memory transistor during the write operation can be cut off by the second selecting transistor, so that the write operation can be effectively carried out. Therefore, the threshold voltages of the memory transistor in its write state and its erasure state can be set within a wide range of changing. Secondly, the impurity diffusion layer connected with the bit line is only for the drain diffusion layer in the second selecting transistor in each of the transistor groups, so that the bit line capacity can be made small.

Figure 8:
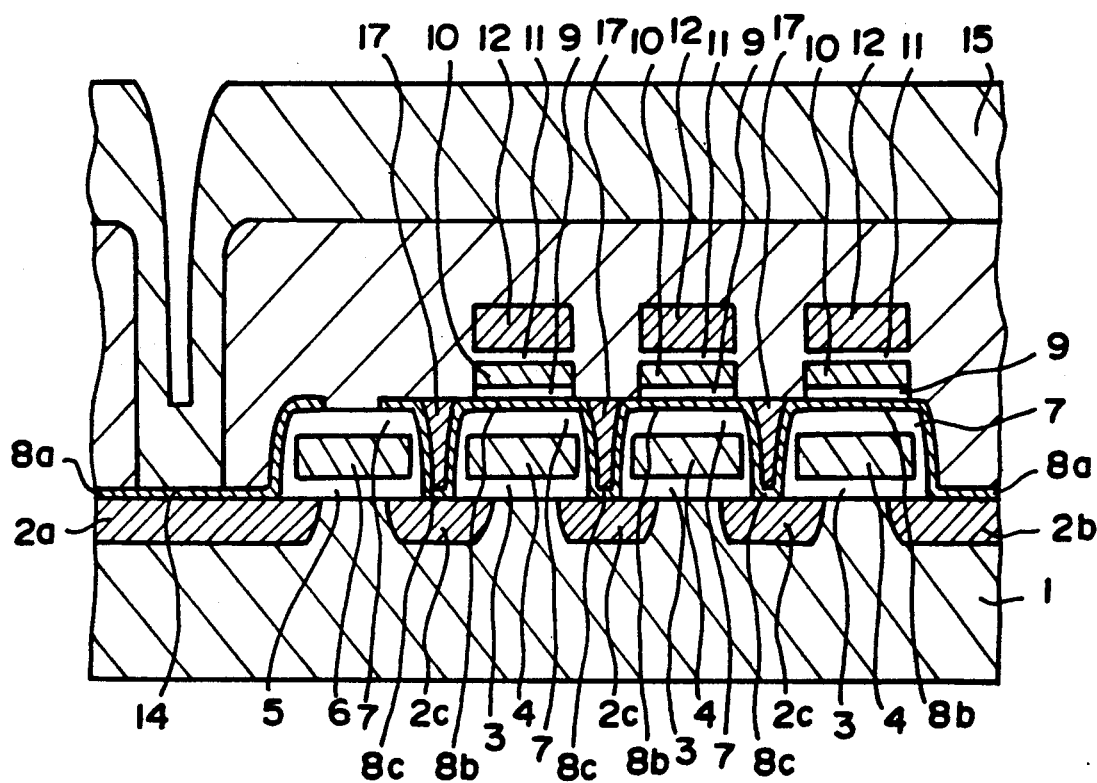
FIG. 8 is a sectional view of the longitudinal structure of the non-volatile semiconductor memory device of a second embodiment according to the present invention.

FIG. 8 shows the sectional structure of the non-volatile semiconductor memory device according to the second embodiment of the present invention, the structure being corresponding to that of FIG. 3A in relation to the first embodiment. This embodiment is different from the first embodiment in that a polysilicon film 17 is provided on the source/drain region 8c on the polysilicon connecting the memory MOS transistors in series in such a manner that it is embedded between the first selecting MOS transistors and also between the first selecting MOS transistor and the second selecting MOS transistor, and the polysilicon film is highly doped with the impurities (e.g., Phosphorus (P) or Arsenic (As)) of the same conductivity type as that of the source/drain region 8c of the memory MOS transistor. This permits the interval between the selecting transistors arranged at the lower layer to be decreased, so that the memory device can be fabricated with higher integration density. The remaining structure, operation and functions in this second embodiment are entirely the same as in the previous embodiment.

In accordance with the present invention, a memory transistor and a first selecting transistor are connected in parallel to form a transistor pair. A plurality of such transistor pairs are connected in series to form a transistor group. A second selecting transistor is connected between a bit line and the transistor group comprising the memory transistors and the first selecting transistors. The memory transistor is over-layered above the first selecting transistor. The above arrangement of the non-volatile semiconductor memory device according to the present invention provides the following advantages.

(1) It is not necessary to set an intermediate potential in the selective data writing. Only two potentials are sufficient for the purpose and this makes it easy to design a peripheral circuit and a control circuit.

(2) Such problems as an excess write and an excess erasure do not occur. This means that the threshold voltage of the memory transistor may vary with no upper and lower limits. Thus, a large change in the threshold voltage of the memory transistor is permitted in write and erasure of data. Therefore, the peripheral circuit, particularly the control circuit for write can be designed simply and easily. Even if there is a difference in the write characteristics in fabricating the memory transistor, the high production yield can be maintained because of the permitted wide range of change in the threshold voltage.

(3) The injection of hot electrons can be adopted for data write, so that the electric field in the first gate insulating film of a non-selected memory transistor during the write operation can be made smaller than that in the erasure operation. Erroneous write for the non-selected memory transistor connected with the same word line during the write operation can be effectively prevented. Further, the threshold voltage of the memory transistor after the data write can be set with the low voltage at the control gate electrode of, e.g., 0 V, so that the voltage at the control gate electrode during the write operation is relatively low. Thus, a transistor having high breakdown voltage characteristics is not required for the decoder for driving the first word line, so that the decoder can be easily designed.

(4) The data write is not effected on the basis of the Fowler Nordheim (F-N) electron tunneling phenomenon. and also the data erasure can be effected on the basis of the avalanche breakdown and the radiation of ultra-violet rays as well as the F-N electron tunneling phenomenon. Therefore, a relatively thick (e.g., 130 Å) silicon oxide film can be used as the first gate insulating film of the memory transistor, so that the fabrication of the first gate insulating film of the memory transistor can be easily controlled with high production yield.

(5) In the data write operation, the potential at the drain electrode of the memory transistor is low and the electric field in the first gate insulating film is weak, so that erroneous erasure of stored data is unlikely to occur during the data write operation. Therefore, the order of writing data for the memory transistors connected in series in the transistor group is not limited, and so the peripheral circuit can be easily designed.

(6) Word erasing and word writing are available. Namely, only the information on a specific word line can be re-written. Therefore, the stored data can be updated without erasing or storing all the bits of data. This permits the programming time to be greatly shortened.

(7) Since the memory transistor constituting a transistor pair with the first selecting transistor is over-layered on the first selecting transistor, the area occupied by the cells is the same as in the prior art. It is not required to arrange a (second) selecting transistor in the transistor group at the source line side, so that the necessary area for the cell array thus formed can be smaller, and so the memory device having a size smaller than the prior art can be achieved.

As described above, the non-volatile semiconductor memory device according to the present invention has many advantages over those of the prior art.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A non-volatile semiconductor memory device comprising:
    a memory cell array formed by a plurality of memory cell array groups arranged in a matrix form of rows and columns, each of said memory cell array groups including
        a transistor group composed of a plurality of transistor pairs connected in series, each transistor pair including a memory field effect transistor having a floating gate electrode and a control gate electrode, and a first selecting field effect transistor having a gate electrode, said memory transistor and said selecting transistor being connected in parallel with each other, and
        at least one second selecting field effect transistor having a gate electrode and connected in series with one end of said transistor group;
    first word lines each connected with the control gate electrode of said memory transistor for each row;
    second word lines each connected with the gate electrode of said first selecting transistor for each row;
    select lines each connected with the gate electrode of said second selecting transistor for each row;
    bit lines each connected with a drain electrode of said second selecting transistor for each column; and
    a source line commonly connected with the source electrodes of one of the transistor pairs in each of said memory cell array groups.

2. A non-volatile semiconductor memory device according to claim 1, in which said memory transistor has a channel region over-layered above the gate electrode of said first selecting transistor forming the transistor pair with said memory transistor and disposed on a prescribed area of a semiconductor substrate.

3. A non-volatile semiconductor memory device according to claim 1, in which said memory transistors, said first selecting transistors and said second selecting transistor in each of said memory cell array groups are all MOS field effect transistors of an N-channel type.

4. A non-volatile semiconductor memory device according to claim 1, which further comprises polysilicon films highly doped with the impurities having same conductivity type as the source/drain regions of said memory transistors, said polysilicon films being embedded between said first selecting transistors and also between said first selecting transistor and said second selecting transistor.

* * * * *